(12) United States Patent
Zheng et al.

(10) Patent No.: US 8,225,739 B2
(45) Date of Patent: Jul. 24, 2012

(54) AUTOMATIC DISPENSING MACHINE

(75) Inventors: Yong Zheng, Tu-Cheng (TW); LuYang Chen, Tu-Cheng (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 514 days.

(21) Appl. No.: 12/509,445

(22) Filed: Jul. 25, 2009

(65) Prior Publication Data
US 2011/0017133 A1    Jan. 27, 2011

(51) Int. Cl.
*B05C 5/02* (2006.01)
(52) U.S. Cl. ......... 118/323; 118/410; 118/500; 156/578
(58) Field of Classification Search .................. 118/300, 118/323, 410, 500; 427/207.1, 96.1; 156/578; 222/160, 165, 166
See application file for complete search history.

(56) References Cited

U.S. PATENT DOCUMENTS

| | | | | |
|---|---|---|---|---|
| 4,239,576 A | * | 12/1980 | Taki et al. ...................... | 156/297 |
| 5,336,357 A | * | 8/1994 | Layher et al. .................. | 156/391 |
| 5,509,966 A | * | 4/1996 | Sykes ............................ | 118/697 |
| 5,938,871 A | * | 8/1999 | Nakahira et al. ................ | 156/64 |
| 7,192,484 B2 | * | 3/2007 | Chappa et al. ................ | 118/300 |
| 2003/0230488 A1 | * | 12/2003 | Lee et al. ....................... | 204/453 |

* cited by examiner

*Primary Examiner* — Laura Edwards
(74) *Attorney, Agent, or Firm* — Lin & Associates IP, Inc.

(57) ABSTRACT

An automatic dispensing machine adapted for dosing adhesive to a product includes a base frame having a flat operating platform, at least two positioning apparatuses disposed on the operating platform for securing the product respectively, a sliding support slidably mounted onto the base frame and capable of being driven to slide above the positioning apparatuses, and a storage container vertically slidably mounted onto the sliding support by means of a container stand for storing the adhesive and capable of being driven by the sliding support to suspend over another one of the positioning apparatuses from one of the positioning apparatuses for dosing the adhesive to the product. When the automatic dispensing machine processes the product positioned in another positioning apparatus, the former processed product secured on one positioning apparatus can be simultaneously disassembled therefrom and another product is repositioned to the one positioning apparatus.

7 Claims, 3 Drawing Sheets

AUTOMATIC DISPENSING MACHINE

BACKGROUND OF THE INVENTION

1. Field of the Invention

The present invention generally relates to an automatic dispensing machine, and more particularly to an automatic adhesive dispensing machine.

2. The Related Art

An automatic dispensing machine is generally used for IC package, LED package, fixing electronic components onto PCB, coating adhesive onto a substrate and so on. However, it is used only after a product being processed by the automatic dispensing machine, and then the processed product being disassembled from the automatic dispensing machine and the next dispensing operation being carried out by means of repositioning another product to the automatic dispensing machine. As a result, the automatic dispensing machine stops working when the operators disassemble the processed product from the automatic dispensing machine and then reposition another product to the automatic dispensing machine so that it results in a relatively lower productivity corresponding to the automatic dispensing machine. Therefore, an improved automatic dispensing machine capable of overcoming the foregoing problem is required.

SUMMARY OF THE INVENTION

An object of the present invention is to provide an automatic dispensing machine adapted for dosing adhesive to a product. The automatic dispensing machine includes a base frame having a flat operating platform, at least two positioning apparatuses disposed on the operating platform for securing the product respectively, a sliding support slidably mounted onto the base frame and capable of being driven to slide above the positioning apparatuses, and a storage container vertically slidably mounted onto the sliding support by means of a container stand for storing the adhesive therein and capable of being driven by the sliding support to suspend over another one of the positioning apparatuses from one of the positioning apparatuses for dosing the adhesive to the product. When the automatic dispensing machine processes the product positioned in another one of the positioning apparatuses, the former processed product secured on one of the positioning apparatuses can be simultaneously disassembled therefrom and another product will be repositioned to the one of the positioning apparatuses.

As described above, the automatic dispensing machine of the present invention designs at least two positioning apparatuses to make both the operation of dosing the adhesive to the product and the operation of disassembling the processed product and then repositioning another product simultaneously carried out by the automatic dispensing machine and operators respectively so that the productivity of the automatic dispensing machine is improved.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
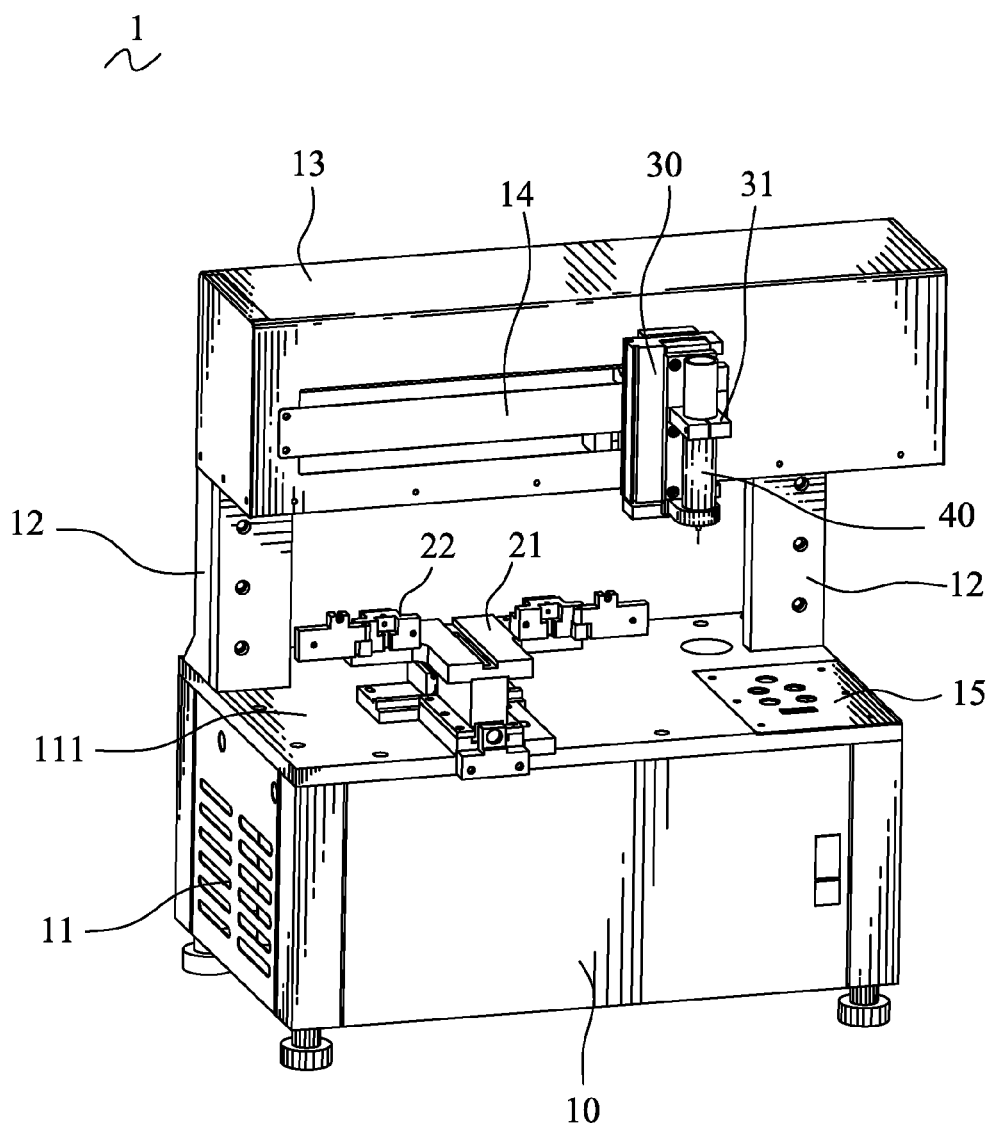
FIG. 1 is a perspective view of an automatic dispensing machine according to the present invention.

With reference to FIG. 1, an automatic dispensing machine 1 in accordance with the present invention includes a base frame 10, a bracket 21, two positioning apparatuses 22, a sliding support 30 and a storage container 40.

The base frame 10 includes a rectangular machine body 11 having a flat operating platform 111 thereon, and a machine nose 13 mounted above the operating platform 111 by means of a pair of spaced studs 12 and having a parallel longwise direction to the operating platform 111. A guiding track 14 is longwise mounted on a side surface of the machine nose 13. The sliding support 30 is slidably mounted onto the guiding track 14, and a container stand 31 is vertically slidably mounted onto the sliding support 30. The storage container 40 is vertically secured by the container stand 31 over the operating platform 111 for storing adhesive therein. A control panel 15 is disposed on the operating platform 111 and can control the sliding support 30 to slide longwise along the guiding track 14, and further control the container stand 31 to drive the storage container 40 to move vertically over the operating platform 111.

Figure 2:
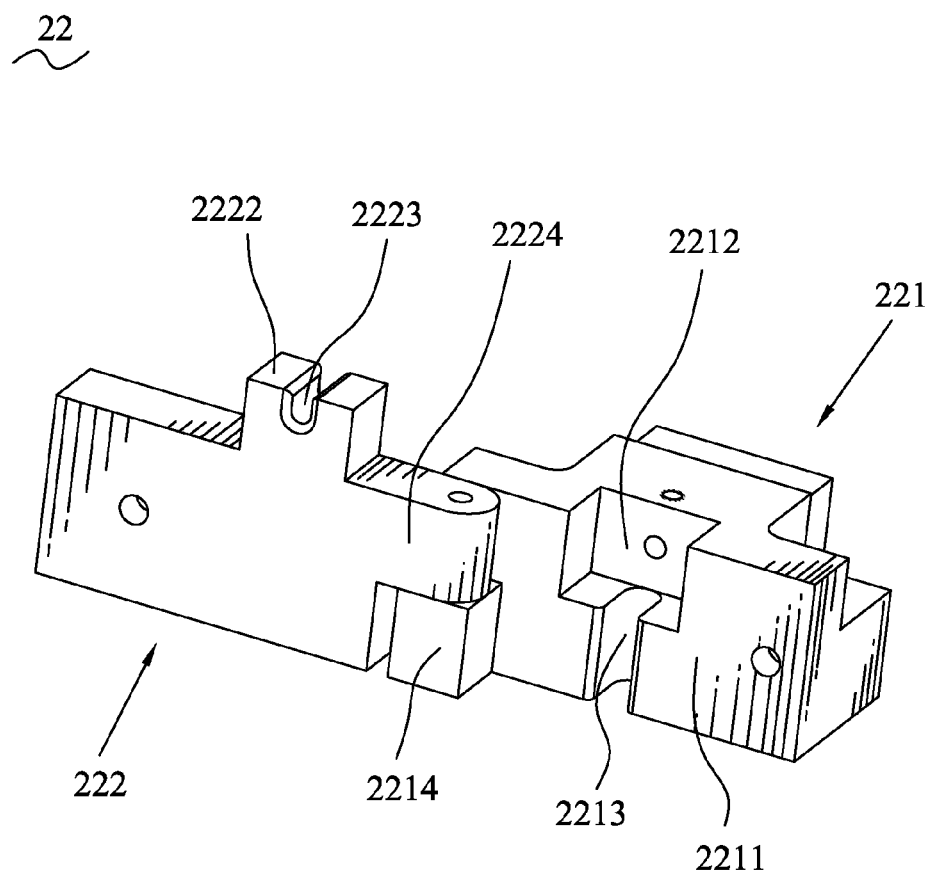
FIG. 2 is a perspective view of a positioning apparatus of the automatic dispensing machine of FIG. 1.
Figure 3:
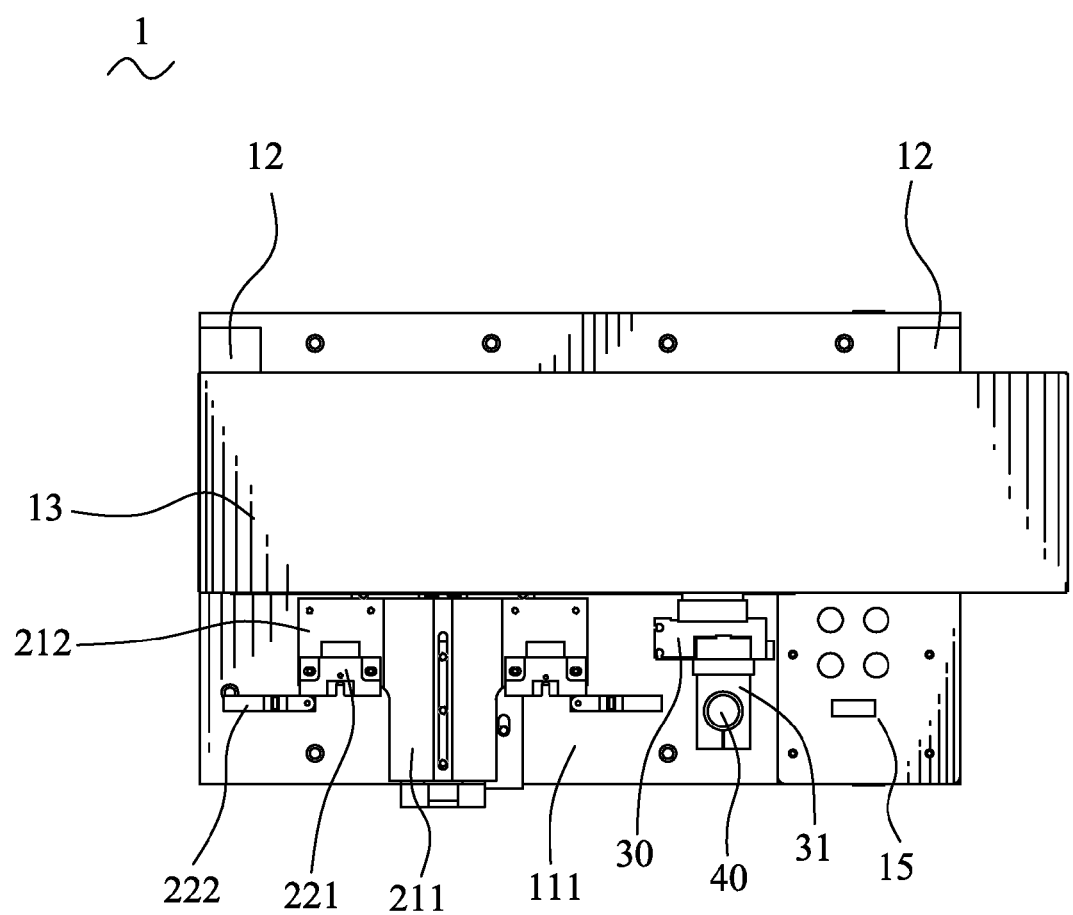
FIG. 3 is a vertical view of the automatic dispensing machine of FIG. 1.

Referring to FIGS. 1-3, the bracket 21 includes a sliding portion 211 slidably mounted on the operating platform 111 and controlled by the control panel 15 to slide along the longwise direction of the operating platform 111 parallel to the slide direction of the sliding support 30 below the sliding support 30. A pair of fastening portions 212 are fastened to two opposite sides of the sliding portion 211 and aligned with each other along the slide direction of the sliding portion 211.

The two positioning apparatuses 22 are respectively mounted to the corresponding fastening portions 212 and symmetrical with each other about the sliding portion 211. The positioning apparatus 22 is adapted for securing a product (not shown) to facilitate the storage container 40 to dose the adhesive onto/into the product to further process the product. In this embodiment, the structure of the positioning apparatus 22 will be described by means of the positioning apparatus 22 being used for securing a cable (not shown). The positioning apparatus 22 includes a positioning body 221 fastened to the corresponding fastening portion 212, and a clipping body 222 pivoted to the positioning body 221. The positioning body 221 is of rectangular shape in substance, and has a mating surface 2211 opposite to the fastening portion 212. A middle of the mating surface 2211 defines a rectangular receiving cavity 2212 and a fastening channel 2213 under the receiving cavity 2212 extending vertically to communicate with the receiving cavity 2212. The receiving cavity 2212 and the fastening channel 2213 are vertically aligned with each other to penetrate through the positioning body 221. The mating surface 2211 of the positioning body 221 protrudes oppositely to the fastening portion 212 to form a pivoting block 2214 at a lower portion of one end thereof far away from the sliding portion 211. The clipping body 222 is of rectangular shape in substance to match with the positioning body 221, and is provided with a pivoting portion 2224 at an upper portion of one end thereof. A top edge of the clipping body 222 protrudes upward to form a rectangular clipping block 2222 adjacent to the pivoting portion 2224. A middle of a top of the clipping block 2222 is concaved downward to form a clipping channel 2223 extending perpendicularly to the clipping body 222 to penetrate therethrough. The pivoting portion 2224 is pivotally connected to the pivoting block 2214 so that the clipping body 222 can be rotated between a closed position of being against the mating surface 2211 of the positioning body 221 to partially seal up the receiving cavity 2212 and the fastening channel 2213, and an open position of being far away from the mating surface 2211 to make the receiving cavity 2212 and the fastening channel 2213 fully exposed.

Referring to FIGS. 1-3 again, in use, the cable is firstly positioned and secured to the positioning apparatus 22, then the control panel 15 controls the bracket 21 and the sliding support 30 to relatively slide and further controls the container stand 31 to drive the storage container 40 to move vertically over the cable so as to dose the adhesive into the cable to further process the cable. When the automatic dispensing machine 1 processes the cable positioned in one of the positioning apparatuses 22, the operators can simultaneously disassemble the former processed cable from the other positioning apparatus 22 and reposition another cable to the idle positioning apparatus 22. The operation of positioning the cable to the positioning apparatus 22 is described in detail hereinafter. Firstly, the cable is clipped into the fastening channel 2213 of the positioning body 221 and partially received in the receiving cavity 2212. Then the clipping body 222 will rotate to be against the mating surface 2211 of the positioning body 221 and the cable will be further clipped into the clipping channel 2223. The operation of disassembling the processed cable from the corresponding positioning apparatus 22 is just contrary to the operation of positioning the cable to the positioning apparatus 22 and is not described in detail any more.

As described above, the automatic dispensing machine 1 of the present invention designs two positioning apparatuses 22 to make both the operation of dosing the adhesive into/onto the product and the operation of disassembling the processed product and then repositioning another product simultaneously carried out by the automatic dispensing machine 1 and the operators respectively so that the productivity of the automatic dispensing machine 1 is improved.

What is claimed is:

1. An automatic dispensing machine adapted for dosing adhesive to a product, comprising:
   a base frame having a flat operating platform;
   at least two positioning apparatuses disposed on the operating platform for securing the product respectively, each of the positioning apparatuses including a positioning body and a clipping body pivoted to the positioning body to clip the product therebetween;
   a sliding support slidably mounted onto the base frame and capable of being driven to slide above the positioning apparatuses; and
   a storage container vertically slidably mounted onto the sliding support by means of a container stand for storing the adhesive therein and capable of being driven by the sliding support to suspend over another one of the positioning apparatuses from one of the positioning apparatuses for dosing the adhesive to the product, wherein when the automatic dispensing machine processes the product positioned in the another one of the positioning apparatuses, the former processed product secured on the one of the positioning apparatuses can be simultaneously disassembled therefrom and another product is repositioned to the one of the positioning apparatuses.

2. The automatic dispensing machine as claimed in claim 1, further comprising a bracket slidably mounted on the operating platform, the positioning bodies of the positioning apparatuses being respectively fastened to the bracket.

3. The automatic dispensing machine as claimed in claim 1, wherein the positioning body has a mating surface defining a receiving cavity and a fastening channel communicating with each other and vertically aligned with each other to penetrate through the positioning body, a pivoting block is protruded on one end of the mating surface, the clipping body is provided with a pivoting portion at one end thereof and a clipping block protruded at a top edge of the clipping body and having a clipping channel thereon concaved downward, the pivoting portion is pivotally connected to the pivoting block to make the clipping body rotated to be against the mating surface of the positioning body for clipping the product in the fastening channel and the clipping channel, and the product is partially received in the receiving cavity.

4. The automatic dispensing machine as claimed in claim 3, wherein the fastening channel extends vertically under the receiving cavity, and the clipping channel extends perpendicularly to the clipping body to penetrate through the clipping block.

5. The automatic dispensing machine as claimed in claim 1, wherein the base frame includes a machine body having the flat operating platform thereon, and a machine nose mounted above the operating platform by means of a pair of spaced studs, the sliding support is slidably mounted onto a side surface of the machine nose.

6. The automatic dispensing machine as claimed in claim 5, wherein a guiding track is mounted on the side surface of the machine nose, the sliding support is slidably mounted onto the guiding track.

7. The automatic dispensing machine as claimed in claim 1, wherein the container stand is vertically slidably mounted onto the sliding support, and the storage container is secured by the container stand.

* * * * *